United States Patent [19]
Delgado et al.

[11] Patent Number: 5,825,092
[45] Date of Patent: Oct. 20, 1998

[54] INTEGRATED CIRCUIT WITH AN AIR BRIDGE HAVING A LID

[75] Inventors: Jose Avelino Delgado, Valkaria, Fla.; Stephen Joseph Gaul, Merrimack, N.H.

[73] Assignee: Harris Corporation, Palm Bay, Fla.

[21] Appl. No.: 650,688

[22] Filed: May 20, 1996

[51] Int. Cl.$^6$ .......................... H01L 29/04; H01L 23/48; H01L 29/80
[52] U.S. Cl. .......................... 257/778; 257/777; 257/226; 257/276; 257/277; 257/704; 257/622; 257/787
[58] Field of Search .................................. 257/787, 778, 257/777, 60, 71, 72, 116, 127, 170, 171, 226–240, 251, 276, 277, 307, 308, 304, 301, 534, 535, 586–588, 618–622, 623, 633, 654–704, 734, 737, 738, 644

[56] References Cited

U.S. PATENT DOCUMENTS

| | | | |
|---|---|---|---|
| 3,648,131 | 3/1972 | Stuby | 257/622 |
| 4,675,717 | 6/1987 | Herrero et al. | 257/777 |
| 4,710,798 | 12/1987 | Marcantonio | 257/777 |
| 4,807,021 | 2/1989 | Okumura | 257/777 |
| 5,122,856 | 6/1992 | Komiya | 257/666 |
| 5,198,963 | 3/1993 | Gupta et al. | 357/777 |
| 5,267,020 | 11/1993 | Marsland et al. | 257/528 |
| 5,319,237 | 6/1994 | Legros | 257/778 |
| 5,483,092 | 1/1996 | Kosaki | 257/776 |
| 5,497,013 | 3/1996 | Temple | 257/704 |
| 5,506,451 | 4/1996 | Hyugaji | 257/778 |
| 5,604,383 | 2/1997 | Matsuzaki | 257/778 |
| 5,614,743 | 3/1997 | Mochizuki | 257/276 |

FOREIGN PATENT DOCUMENTS

| | | | |
|---|---|---|---|
| 56-2667 | 1/1981 | Japan | 257/621 |
| 56-12770 | 2/1981 | Japan | 257/621 |
| 5-235194 | 9/1993 | Japan | 257/276 |

*Primary Examiner*—Tom Thomas
*Assistant Examiner*—Alexander Oscar Williams
*Attorney, Agent, or Firm*—Jaeckle Fleischmann & Mugel, LLP

[57] ABSTRACT

An air bridge structure 102 is formed in a cavity of a glass lid substrate. The air bridge structure is bonded to an integrated circuit in a device substrate 82 to provide an air bridge structure coupled to the integrated circuit.

15 Claims, 7 Drawing Sheets

INTEGRATED CIRCUIT WITH AN AIR BRIDGE HAVING A LID

FIELD OF THE INVENTION

The present invention relates to integrated circuit air bridge structures and methods of fabricating such structures which facilitate the formation of the integrated circuits and components thereof at the wafer level. The invention is especially suitable for use in providing integrated circuits which are hermetically sealed so as to protect the integrated circuits and any components, such as interconnecting conductors (known as "air bridges"), inductors or capacitors, against damage or contamination from outside the device.

BACKGROUND OF THE INVENTION

In order to reduce interconnect capacitances in high performance and high frequency processes, air bridges are often used. A typical air bridge is formed using a second layer of interconnect metal deposited and patterned over a sacrificial material. The sacrificial material is later removed to leave a metal line surrounded by air rather than a dielectric, such as oxide. The capacitances to the substrate and other metal lines is thus reduced since air has a lower dielectric constant than do solid insulators such as silicon dioxide or silicon nitride. However, traditional air bridge manufacturing techniques and structures have several disadvantages. The length of an air bridge is often limited by flexure of metal between two vias. So, relatively long air bridges can only be manufactured by stitching together multiple lengths of short air bridges. Another problem is that circuits fabricated with air bridges cannot be passivated. In a normal process, the passivation layer is deposited on top of an integrated circuit. Typical passivation layers are silicon oxide or silicon nitride. However, for air bridge structures, the passivation layer has to be omitted otherwise the passivation layer will fill the air under the bridge and thereby increase the capacitance of the air bridge or damage the bridge itself.

Accordingly, there has arisen a need for air bridges that can be made of longer lengths of metal than are available in air bridges of the prior art and also for air bridges that can be incorporated into integrated circuits where such circuits have a passivation layer.

SUMMARY OF THE INVENTION

It is the principal object of the present invention to provide improved integrated circuit air bridge structures. It is a further object of the present invention to provide improved integrated circuit air bridge structures having components therein which may be formed separately from the active integrated circuit elements thereof and in a part of the structure separate therefrom but ultimately bonded thereto to provide a package, and to methods of fabricating such structures. It is a still further object of the present invention to provide improved integrated circuit air bridge structures which may be fabricated at the wafer level without materially increasing the volume occupied by the integrated circuit and any components.

It is a still further object of the present invention to provide improved integrated circuit air bridge structures having air bridges or other components made out of conductive elements (e.g., inductors or capacitors), wherein sufficient spacing is provided between the air bridges of the components and the active integrated circuit so as to reduce the effect of parasitic capacitance between the conductive elements and the circuits and which can adversely affect the high frequency response of these circuits, as well as to methods of fabricating such structures.

The invention may attain one or more, but not necessarily all, of the foregoing objects.

Briefly described, an integrated circuit structure in accordance with the invention provides an air bridge fabricated on a quartz or glass lid substrate that is bonded to a device wafer having one or more integrated circuits. The device wafer comprises a substrate of semiconductive material in which an active integrated circuit may be provided. The lid wafer has cavities formed in a surface that is bonded to the device wafer. The cavities contain inductors or capacitors and leads or bumps for connecting the capacitors or inductors of the lid wafer to integrated circuits in the device wafer. The air bridge conductor may be formed in the lid wafer separately and at temperatures lower than temperatures used in forming the active integrated circuit. Since high temperature bonding is not necessary to provide the bonded assembly, low temperature materials, such as metal pads or bumps, oxide layers and even plastic polymeric material, may be used to attach the contacting surface areas of the lid wafer and the device wafer.

The foregoing and other objects, features and advantages of the invention as well as presently preferred embodiments thereof and the best known techniques for fabricating integrated circuit structures in accordance with the invention will become more apparent from a reading of the following description in connection with the accompanying drawings.

DRAWINGS

FIG. 6 is a sectional view similar to FIG. 1 of another enclosed, bonded, multi-layer device with a conductive element providing an air bridge over an open space in the device, the view being taken along the line 6—6 in FIG. 7;

DETAILED DESCRIPTION

Figure 1:
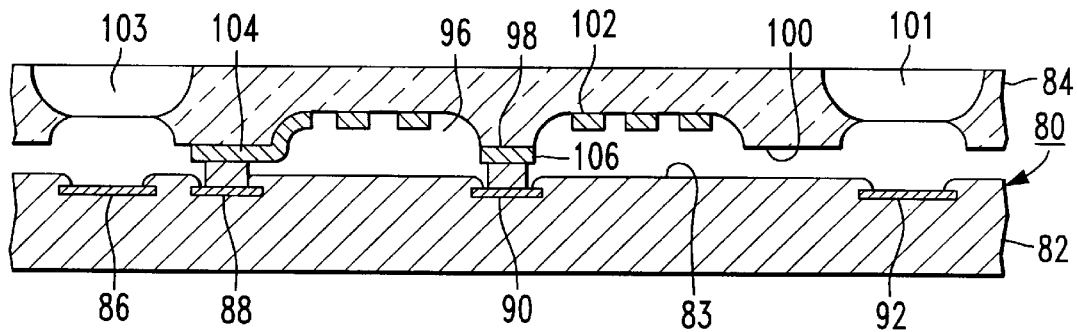
FIG. 1 is a sectional view of an integrated circuit device having a conductive member forming an inductor disposed over an open space in the device and providing an enclosed bonded, multi-layer device which is protected against damage and contamination by virtue of the enclosure of the open space therein.
Figure 2:
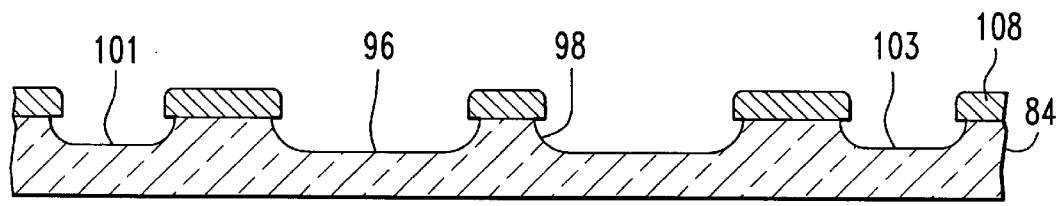
FIGS. 2 to 6 are sectional views illustrating the device of FIG. 1 in successive stages of the fabrication thereof.
Figure 6:
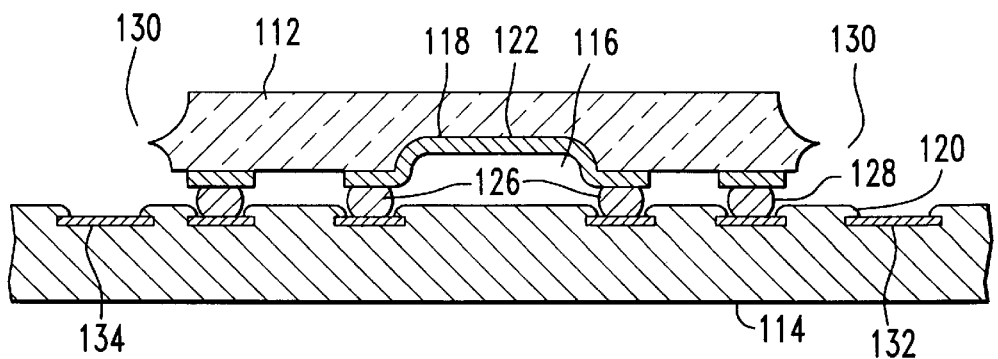
Figure 7:
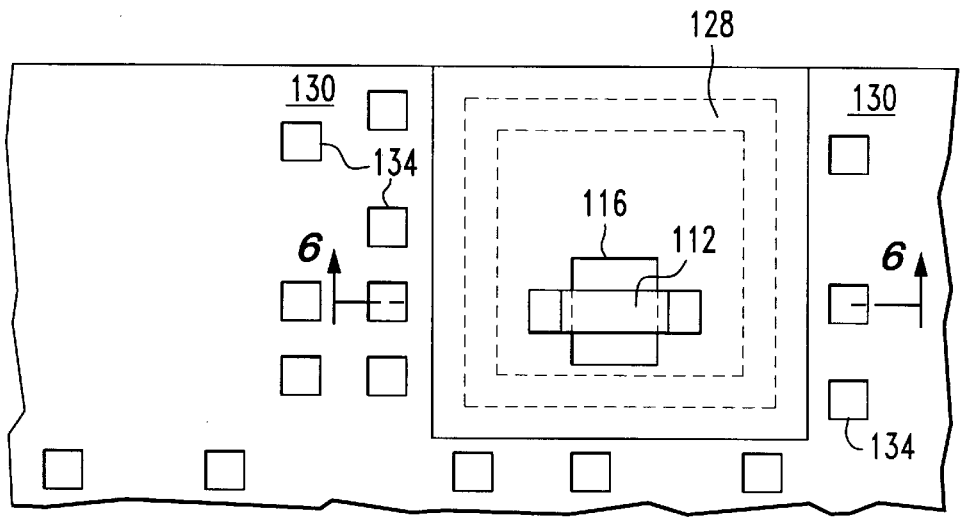
FIG. 7 is a plan view of the device shown in FIG. 6.
Figure 8:
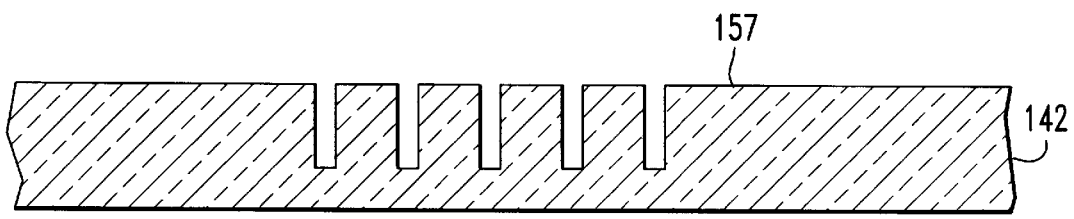
FIGS. 8 through 12 are sectional views illustrating the device shown in FIGS. 13 and 14 in successive stages of the fabrication thereof.

Referring to FIG. 1 there is shown an integrated circuit structure 80 formed on device wafer 82 in which active circuit areas extending to an interface surface 83 which has bond pads 86, 88, 90 and 92. A lid wafer 84 is made of glass or of semiconductive material (e.g., silicon) having an insulating (oxidized) surface. This lid wafer 84 has openings 101 and 103 for bond wires to the pads 86 and 92. An annular cavity 96 around a post which forms a hub 98 in the cavity 96 extends to an interface surface 100 facing the surface 83 of the substrate 82. The cavity is sufficiently spaced from the surface 83 to reduce parasitic capacitance in the integrated circuit 80. Lining the cavity is a conductive inductive element (an inductor) in the form of a metal coil 102. The metal is deposited and patterned on the surface of the cavity to have ends 104 and 106 from the outer and the center end respectively of the coil 102. These ends 104 and 106 are connected to the pads 88 and 90 and via the pads to the integrated circuits in the substrate 82. The connection may be by "flip chip bonding" of the glass wafer 84 to the semiconductor wafer 82. In addition a bond 126 may provide an edge seal such as shown in FIGS. 6 and 7 around the cavity 96 enclosing both the conductive element (inductor 102) and the integrated circuits in the substrate 82.

Referring to FIGS. 2–5 the steps in the fabrication of the structure shown in FIG. 1 will become more apparent. The process starts with a lid wafer 84 which is preferably of a glass material and has a thermal coefficient of expansion similar to the material (silicon) of the substrate wafer 82. The cavity 96 and partial vias 101 and 103 are formed after masking with a photoresist layer 108 and etching the exposed surface 100 of the lid wafer 84. A wet or dry etching technique may be used to form these cavities 96, 101 and 103.

Figure 3:
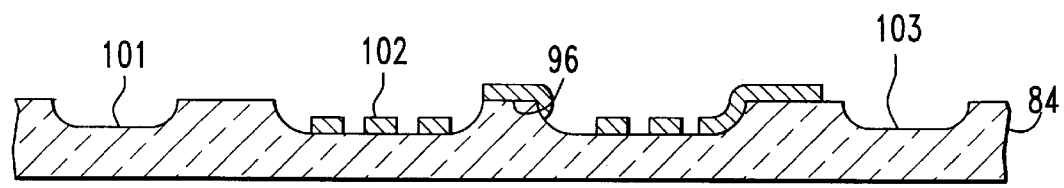

As shown in FIG. 3 a layer of metal is uniformly deposited on the surface of the cavities 96, patterned and etched to provide conductive lines 102 in the form of a coil forming an inductor.

Figure 4:
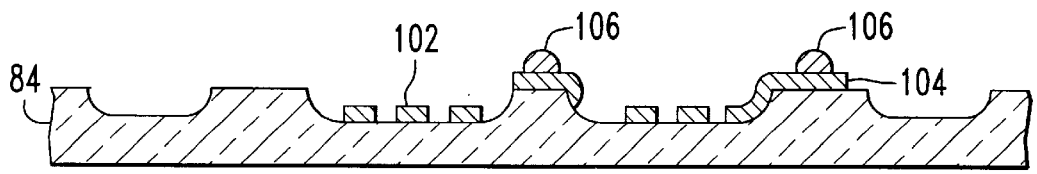

As shown in FIG. 4 a further masking operation is used to form the bond points at the ends 104 and 106 of the coil 102. One possible method for implementing these bond points is a masking operation followed by an electroless plating of a suitable material.

Figure 5:
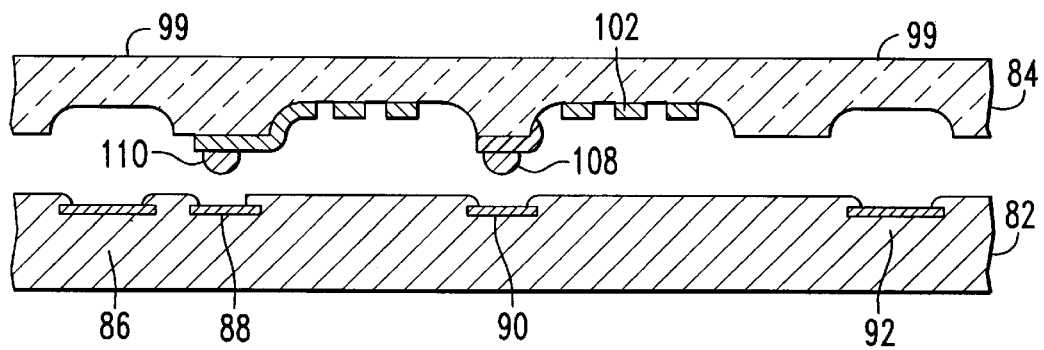

FIG. 5 shows the mating (overlaying and alignment) of the lid wafer 84 to the substrate wafer 82. The bump bonds 108 and 110 bond at a relatively low heat, about 200° C. as compared to the heat (≧700° C.) used in forming the active integrated circuit regions on the substrate 82. A final operation not shown on FIG. 5 involves the definition and etching of via areas on surface 99 which when combined with the previously formed cavities 101 and 103 of FIG. 1 can overlay both bond pad and scribe regions of 82 so as to allow die separation and bonding in the conventional manner.

Referring to FIGS. 6 and 7 there is shown a structure also having a lid layer 112 of insulating material, such as glass, and a substrate layer 114 of semiconductive material. The layers 112 and 114 are both wafers and the active integrated circuits may be formed in the substrate layer 114 separately and apart from the fabrication of the lid wafer 112. A single cavity 116 with a surface 118, which is also the surface of the lid wafer 112 which defines the interface with a surface 120 of the substrate wafer, is sufficiently spaced from the integrated circuits so that an air bridge or interconnecting conductive element 122 has reduced coupling (via parasitic capacitance) to the integrated circuit in the substrate 114. The ends of the air bridge conductor 122 are connected via bond pads or bumps 126 to bond pads which are connected to the integrated circuits interconnected by the air bridge conductor 122. Another metal bond or bump area 128 rims the cavity 116 and provides an edge seal for the air bridge and the active circuit elements thereunder. This seal may be a hermetic seal which provides protection of the air bridge against contamination and/or damage. The wafers 112 and 114 also protect the cavity and the air bridge conductor 122.

The vias 130 expose bond pads 132 and 134. These vias 130 may be extended to provide areas free of the lid wafer 112. A plurality of such bond pads 132 and 134 are provided so as to afford sufficient connections for leads to the active integrated circuits on the substrate wafer 114. The cavities 116 and the conductors therein are protected by the edge seal 128.

Figure 13:
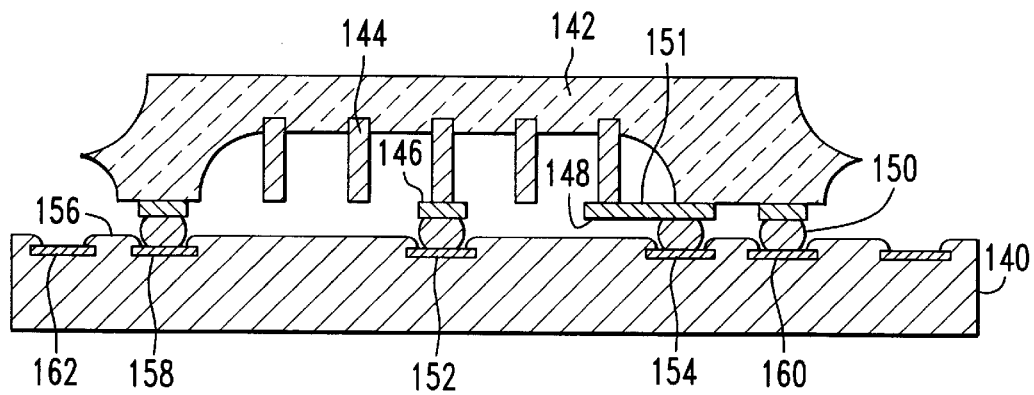
FIG. 13 is sectional view similar to FIGS. 1 and 6 showing a conductive member forming an inductor within the device, the device being a sealed, multi-layer structure which facilitates handling and minimizes contamination, the view being taken along the line 13—13 in FIG. 14.
Figure 14:
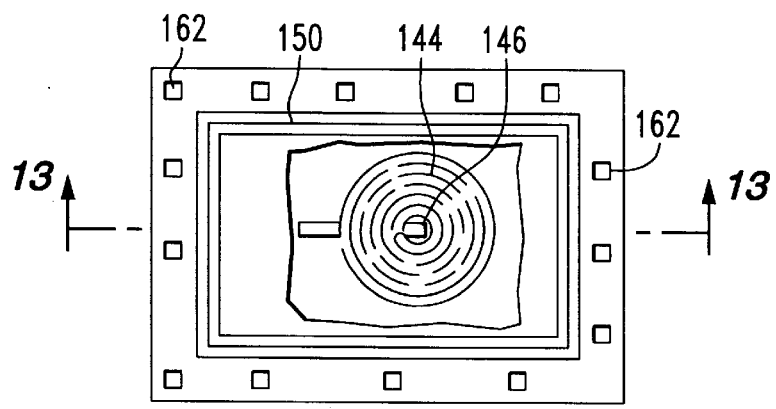
FIG. 14 is a plan view of the device shown in FIG. 13, the view being broken away to illustrate the configuration of the conductive member forming a coil.

Referring to FIGS. 13 and 14 there is shown a structure similar to that of FIG. 1 having a substrate wafer 140 of semiconductive material with active integrated circuits and bond pads and a lid wafer 142, which is shown with an inductor provided by a coil 144 of metal. Bond pads 146 and 148 are extended to the ends of the coil and are bonded via bump points to bond pads 152 and 154 in the interface surface 156 of the semiconductor material substrate wafer 140. Other bond pads 160 and 158 provide an edge seal similar to the edge seal 128 (FIGS. 6 and 7). This edge seal is indicated at 150. Other bond pads 162 are provided in the surface 156 for connecting to the active integrated circuits in the substrate 140.

Figure 9:
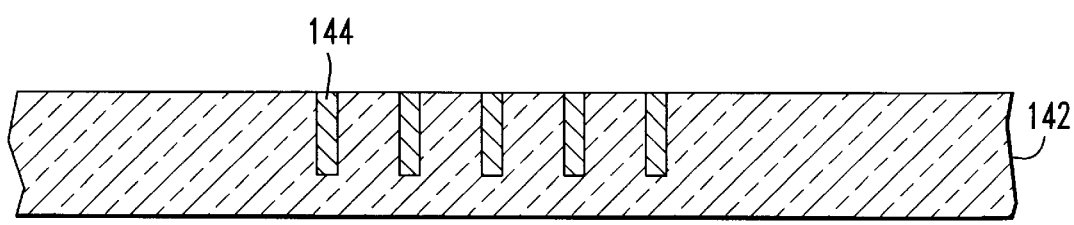

Referring to FIGS. 8–12 there is shown a process for providing the air bridge inductor element for coil 144 in the lid wafer 142 shown in FIGS. 13 and 14. Starting with the wafer 142 trenches, at least several microns deep, are etched using a photoresist masking operation preceding etching. Etching may be by a dry etching technique. The pattern which is etched is in the shape of the spiral inductor coil 144. As shown in FIG. 9 metal is deposited in the trenches using reflow sputtering and CMP (chemical mechanical polishing) to fill the trenches. Silicided polysilicon or any other via refilling ("stuffing") material may also be utilized.

Figure 10:
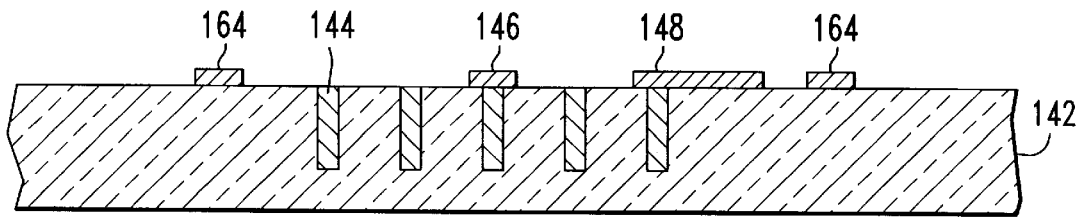

As shown in FIG. 10, a second level of metal is deposited and patterned using photolithography to provide the connections 146 and 148. A pad 164 for the edge seal is also patterned from the deposited metal. The pattern is defined using photoresist or other masking and wet or dry etching.

Figure 11:
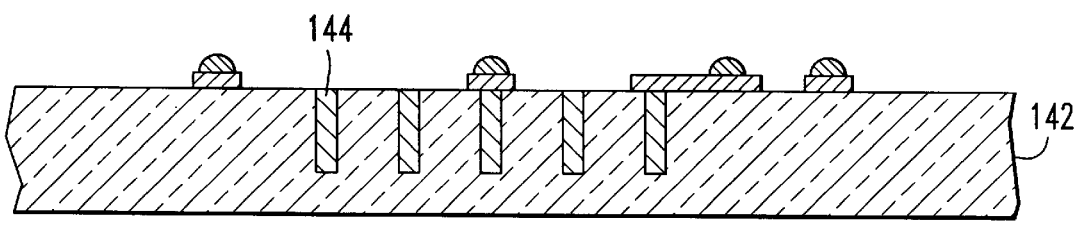

As shown in FIG. 11, the connecting points (bump metal) are then applied by another deposition and masking process similar to that used to form the connect metal pads 146, 148 and the pad 164.

Figure 12:
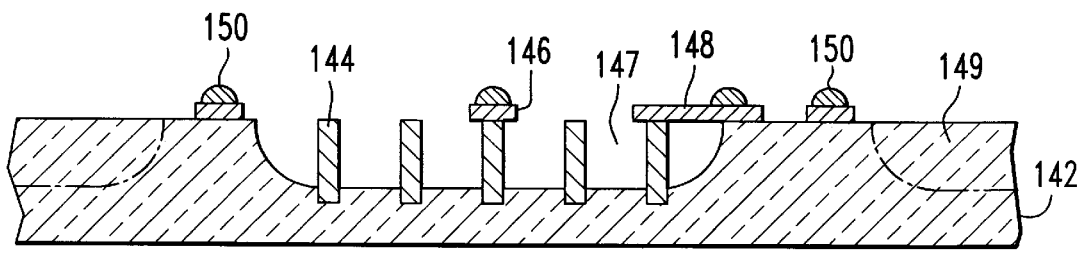

An optional implementation is shown in FIG. 12. A level of bump metal is deposited an patterned to form bump metal points. A rim of bump metal defines the edge seal 150. After the bumps are formed, photoresist patterning and oxide etch steps are used to produce a cavity 147 around the inductor. The etching agent selectively removes the substrate material 142 and does not remove the metal 144. The etch is controlled and stops short of the ends of the coil 144. The remaining material forms cavity 147 and leaves a region of the wafer which supports the coil 144. The cavity 147 decreases the capacitance between the turns of the coil as well as between the coil and the integrated circuit in the substrate layer 140. This glass removal serves to decrease the capacitance between turns of the inductor. An optional cavity 149 for scribe line and bond pad openings as described previously can also be made at this time. The glass wafer 142 is attached to the device wafer 82 as described in connection with FIG. 6. FIG. 13 shows the completed structure with the glass air bride attached to the device wafer.

Figure 15:
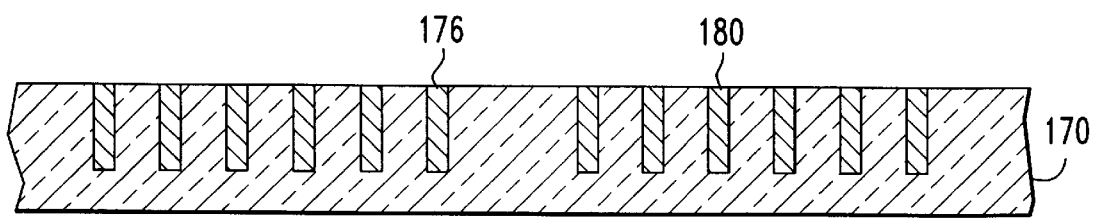
FIGS. 15–17 are sectional view illustrating steps for forming a device having conductive members which provide a capacitor and an inductor, respectively.
Figure 16:
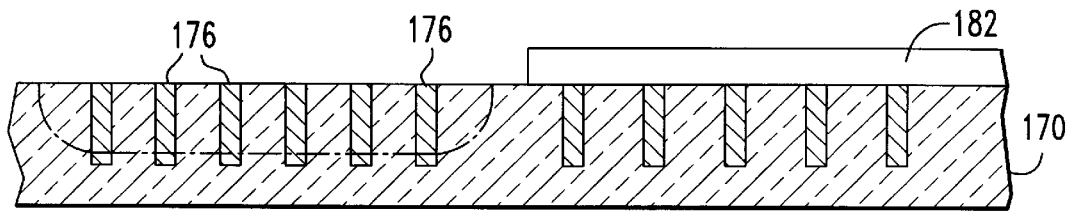
Figure 18:
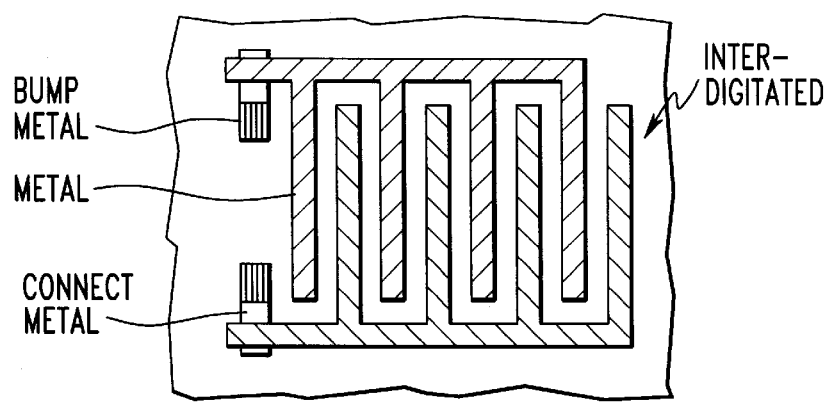
FIGS. 18 and 19 are fragmentary views which illustrate different conductor configurations which may be used to provide the capacitor section of the devices shown in FIG. 17.
Figure 19:
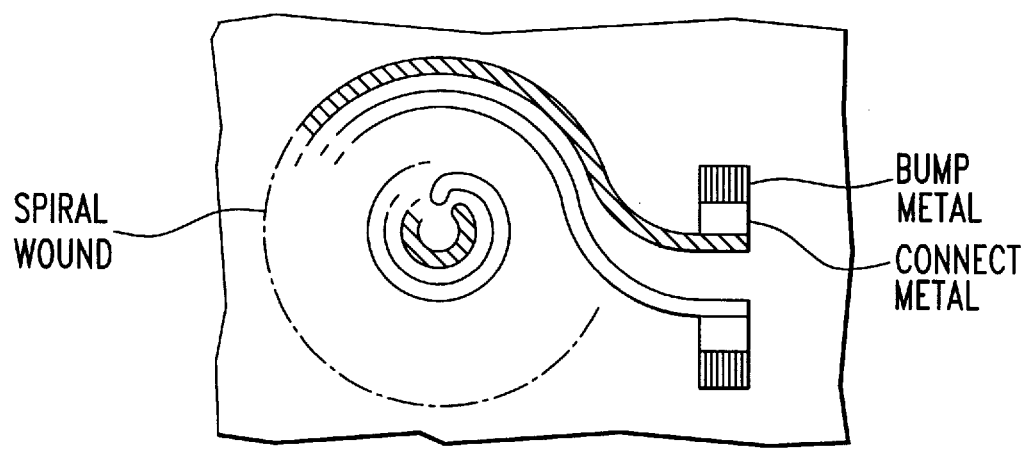

The damascene process of FIGS. 8–12 can be used to form capacitors on the same glass substrate as inductors. The capacitor formation process begins with a glass wafer with completed metal filled and planarized trenches as shown in FIG. 15. The metal 176 will form plates of a capacitor and the metal 180 will form the windings of an inductor. The capacitor can be formed either as interdigitated conducting trenches or two long coiled trenches. Where a dielectric other than glass is desired, photoresist and etch steps are used to define a cavity around the capacitor metal 176. The inductor metal 180 is masked with a suitable resist 182 and the glass between capacitor plates 176 is removed to expose the sides of the plates (FIG. 16). The etch stops before the ends of the plates 176 are exposed so the ends of the plates 176 remain embedded in the glass substrate 170. A suitable dielectric may be deposited in the spaces between the plates 176 to form the capacitor. The dielectric is deposited using low pressure chemical vapor deposition, chemical vapor deposition, spin-on or other deposition technique, and the capacitor cavity is planarized. Typical dielectrics include silicon nitride and silicon dioxide. Depending on the application, the air spaces between the plates may also be used as a dielectric. Therefore, the structure can either be used as a capacitor or an inductor. If a decoupling capacitor is desired, as in the case of power supplies, a PZT (lead zirconate titanate) or PLT (Pb-La-Ti-O) film may be applied using multiple spin-on/bake operations for the PZT or PLT films. In that case, a high temperature trench metal is required. A high capacitance per unit area is quite useful for chip level power supply decoupling. The trenches and the capacitor plate patterns may either be interdigitated, as shown in FIG. 18, or spiral wound as shown in FIG. 19. The capacitors are effectively thin film devices. The characteristics of such devices are described in an article by Sandwip K. Dey and Jon-Jan Lee, entitled "Cubic Paraelectric (Nonferroelectric) Perovskite PLT Thin Films with High Permitivity for Ulsi Dram's and Decoupling Capacitors," IEEE Trans. ED., Volume 39, Number 7, July 1992, pages 1607–1613, and in an article by Reza Moazzami, Chemming Hu and William H. Shepard, entitled "Electrical Characteristics of Ferroelectric PZT Thin Films for Dram Applications," IEEE Trans. ED., Volume 39, Number 9, September 1992, pages 2044–2049. Both articles are incorporated herein by reference.

Figure 17:
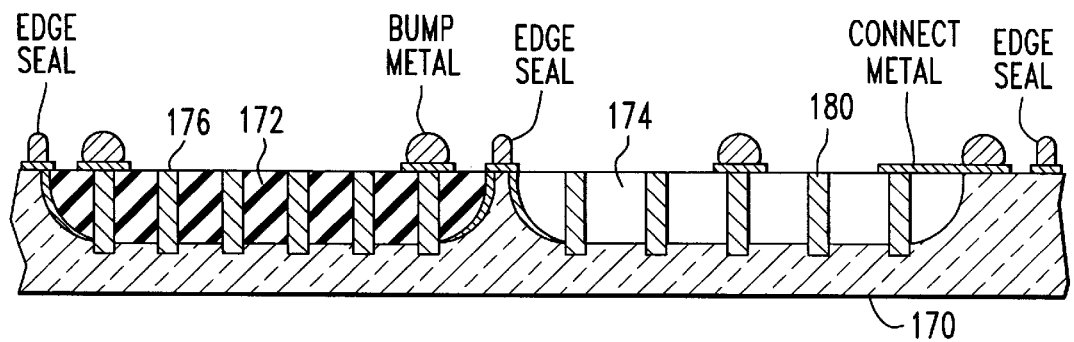

After planarization of the dielectric, processing continues with the deposition and patterning of the interconnect metal, bump metal and inductor cavity masking and etching to produce the structure shown in FIG. 17. There is shown a lid wafer 170 having separate cavities 174 and 176 which contain different passive components, particularly a capacitor 178 and an inductor coil 180. The inductor coil in the cavity 174 may be formed in the same manner as described in connection with FIGS. 8–12. In addition separate edge seals may be provided around the perimeter of each of the cavities 174 and 176. The structure of FIG. 17 may be mated to an integrated circuit in the same manner shown above in FIGS. 1–13. Removal of the glass around the inductor is optional.

Those skilled in the art will also recognize that the invention may be used to fabricate rugged air bridge metal interconnections between semiconductor devices and between integrated circuits.

Having disclosed one embodiment, those skilled in the art will know that further additions, modifications, changes, and alterations can be made to the disclosed embodiment without departing from the spirit and scope of the invention as claimed below.

We claim:

1. An integrated circuit with an air bridge enclosure comprising:
    a substrate with an integrated circuit;
    a glass wafer with a cavity having an inside surface disposed opposite to and enclosing at least a portion of said integrated circuit;
    a metal conductor on the inside surface of said cavity and above said enclosed portion of said integrated circuit; and
    metal contacts coupling the metal conductor on the inside surface of the cavity to the integrated circuit.

2. The integrated circuit of claim 1 wherein the metal conductor is an inductor.

3. The integrated circuit of claim 1 wherein the cavity comprises a spiral trench.

4. An integrated circuit with an air bridge structure comprising:
    a silicon device substrate comprising an integrated circuit formed in a surface thereof;
    a silicon dioxide lid substrate having a surface bonded to a device substrate, said bonded lid surface having one or more cavities with an inside surface facing the integrated circuit; and
    one or more metal leads on the inside surface of at least one of the cavities.

5. The integrated circuit with an air bridge structure of claim 4 further comprising one or more metal bumps on the surface of the lid wafer, said metal bumps being coupled to said at least one metal lead.

6. The integrated circuit with an air bridge structure of claim 4 further comprising a continuous metal lead formed in the cavities to provide an inductor.

7. The integrated circuit with an air bridge structure of claim 4 further comprising a metal layer formed in at least one cavity to provide a plate of a capacitor.

8. The integrated circuit with an air bridge structure of claim 4 further comprising a metal edge seal surrounding said at least one cavity for bonding the lid wafer to the device wafer.

9. An integrated circuit with an air bridge structure comprising:
    a silicon device substrate comprising an integrated circuit formed in a surface thereof;
    a silicon dioxide lid substrate having a surface bonded to a device substrate, said bonded lid surface having a cavity covering said integrated circuit and said cavity comprising at least one trench; and
    metal filling said trench and extending above said trench in a direction toward said integrated circuit.

10. The integrated circuit of claim 9 further comprising one or more metal bumps on the surface of the lid substrate, said metal bumps being coupled to the metal filling the trench.

11. The integrated circuit of claim 9 wherein the trench has a continuous spiral pattern and forms an inductor.

12. The integrated circuit of claim 9 further comprising at least two trenches spaced a controlled distance from each other and each trench filled with metal to form a capacitor.

13. The integrated circuit of claim 12 wherein the trenches are interdigitated with each other.

14. The integrated circuit of claim 12 wherein the two trenches are concentric spirals.

15. The integrated circuit of claim 9 further comprising a metal edge seal surrounding said trench for bonding the lid substrate to said device substrate.

\* \* \* \* \*